United States Patent
Tarsi et al.

(10) Patent No.: US 9,691,501 B2
(45) Date of Patent: *Jun. 27, 2017

(54) TESTING FOR THRESHOLD VOLTAGE AND BIT CELL CURRENT OF NON-VOLATILE MEMORY ARRAYS

(71) Applicant: Texas Instruments Incorporated, Dallas, TX (US)

(72) Inventors: Trevor John Tarsi, Coppell, TX (US); Daniel Robert Burggraf, III, Parker, TX (US); Nelson Kei Leung, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/829,684

(22) Filed: Aug. 19, 2015

(65) Prior Publication Data

US 2015/0357046 A1  Dec. 10, 2015

Related U.S. Application Data

(63) Continuation-in-part of application No. 13/935,138, filed on Jul. 3, 2013, now Pat. No. 9,142,321.

(51) Int. Cl.
*G11C 29/08* (2006.01)
*G11C 29/44* (2006.01)
(Continued)

(52) U.S. Cl.
CPC ............. *G11C 29/08* (2013.01); *G11C 29/10* (2013.01); *G11C 29/44* (2013.01);
(Continued)

(58) Field of Classification Search
CPC ......... G11C 29/00; G11C 29/08; G11C 29/10; G11C 29/12–29/16; G11C 29/56;
(Continued)

(56) References Cited

U.S. PATENT DOCUMENTS

| 8,949,679 B2* | 2/2015 | Berke | ................. G06F 13/1673 |
| | | | 714/718 |
| 2006/0123280 A1* | 6/2006 | Tran | .................... G11C 11/5621 |
| | | | 714/718 |

(Continued)

*Primary Examiner* — Albert Decady
*Assistant Examiner* — Christian Dorman
(74) *Attorney, Agent, or Firm* — Goutham Kondapalli; Charles A. Brill; Frank D. Cimino

(57) ABSTRACT

A method of testing non-volatile memory arrays. A first test stage including at least a first stage read uses a first step size for setting current for BCC testing and/or voltage for $V_T$ testing for reading at least some memory cells. A second test stage including at least one second stage read uses an adjusted step size less in magnitude than the first step size for reading at least some memory cells. Provided no bit pattern match by the second test stage and/or the adjusted step size does not meet a predetermined minimum resolution (PMR), one or more additional test stages including additional array searching are added using a fixed step size less in magnitude than the adjusted step size including at least one read until a final read determines the predetermined repeating bit pattern is matched and a fixed step size for the final read meets the PMR.

21 Claims, 9 Drawing Sheets

(51) Int. Cl.
  *G11C 29/10* (2006.01)
  *G11C 29/50* (2006.01)
  *G11C 16/00* (2006.01)
(52) U.S. Cl.
  CPC ........ *G11C 29/50004* (2013.01); *G11C 16/00* (2013.01); *G11C 2029/5004* (2013.01); *G11C 2029/5006* (2013.01)
(58) Field of Classification Search
  CPC .................. G11C 29/56004–29/56016; G11C 2029/5002; G11C 2029/5004; G11C 2029/5006
  USPC ......... 714/718–723; 365/201, 185.19, 185.2, 365/185.21, 185.24
  See application file for complete search history.

(56) References Cited

U.S. PATENT DOCUMENTS

| | | | | |
|---|---|---|---|---|
| 2009/0135646 A1* | 5/2009 | Murin | ................. | G11C 11/5642 365/185.2 |
| 2010/0246298 A1* | 9/2010 | Zhang | .................... | G11C 5/147 365/200 |
| 2012/0239976 A1* | 9/2012 | Cometti | ................. | G11C 16/26 714/24 |
| 2014/0334228 A1* | 11/2014 | Kim | .................... | G06F 11/1072 365/185.03 |

* cited by examiner

| VTx TYPE | TYPICAL VALUE (V) | FLASH CONTENT | COMPARE VALUE | LOOK FOR FIRST |
|---|---|---|---|---|
| VT0max | $V_1$ | PROG (0) | FFFF | PASS |
| VT0min | $V_2$ | PROG (0) | 0000 | PASS |
| VT1max | $V_3$ | ERASED (1) | FFFF | PASS |
| VT1min | $V_4$ | ERASED (1) | 0000 | PASS |
FIG. 2A
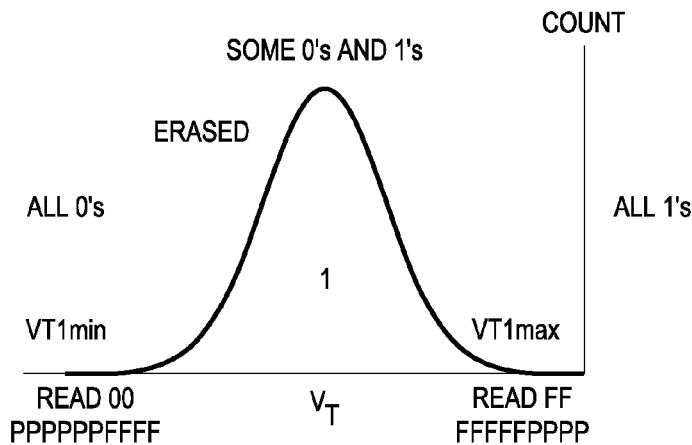
FIG. 2B
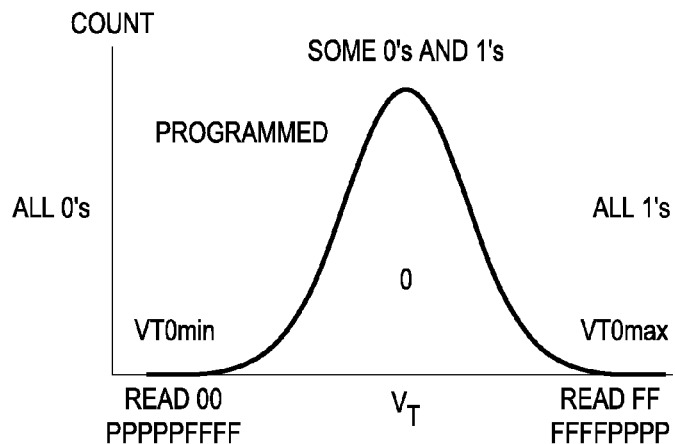
FIG. 2C

TESTING FOR THRESHOLD VOLTAGE AND BIT CELL CURRENT OF NON-VOLATILE MEMORY ARRAYS

CROSS REFERENCE TO RELATED APPLICATIONS

This application is a Continuation-in-part and claims benefit of U.S. patent application Ser. No. 13/935,138, filed on Jul. 3, 2013. Said application incorporated herein by reference in its entirety.

FIELD

Disclosed embodiments relate to the electrical testing of non-volatile memory arrays in semiconductor devices, and semiconductor devices including non-volatile memory.

BACKGROUND

Non-volatile semiconductor memory devices that have an array of memory cells is a basic building block in computer systems and semiconductor devices that store data. Typical non-volatile memory arrays are arranged in rows and columns of memory cells ("cells"), where each cell in the array typically provides two different states, and each cell can be uniquely addressable. However, non-volatile memory cells that provide more than two possible states are also known.

Finding the threshold voltage ($V_T$) or bit cell current (BCC) of the cells in the non-volatile memory of a semiconductor device is used in production testing for stability testing to ensure the long term reliability of the memory for holding data. For example, one example semiconductor device having non-volatile memory is a microcontroller (MCU) which generally includes a central processing unit (CPU) and a flash memory array as the main memory where the customer's firmware generally resides.

One type of known flash memory cell is based on a dual gate field effect transistor (FET) that includes a select gate, a floating gate, a body, a drain, and a source. For read operations, the source of the flash cell is coupled to ground, and the drain of the cell is coupled to a bitline of the flash memory array. The cell is switched on and off by applying a select voltage to the select gate via a wordline that is coupled to the select gate. The extent to which the cell conducts current when the select voltage is applied across the channel of the FET is determined by the threshold voltage $V_T$ of the cell, where the $V_T$ can be increased by trapping electrons on the floating gate.

A typical method for storing information in a flash cell involves trapping of excess electrons on the floating gate to increase the $V_T$ of the cell such that the channel current conducted by the cell is reduced when the select voltage is applied to the select gate. If the cell current is less than a reference current when the select voltage is applied, the cell is said to be "programmed." If the cell current is greater than the reference current when the select voltage is applied, the flash cell is said to be "erased." Since the typical flash memory cell is configured to be in one of two possible states, programmed or erased, the typical flash cell is said to store one bit of data.

The cells in the memory array are generally first set (initialized) to a predetermined repeating bit pattern of ones (1; erased) and/or zeros (0; programmed) before each VT search and/or bit cell current (BCC) search. The memory arrays cells may be set to be all erased (FF) or at least partially programmed (00, checkerboard (CHK), or inverse CHK). Following setting of the states of the memory cells, during the VT/BCC search, an external control voltage/current is applied by automatic test equipment (ATE) to cells in the device and then the content of the all the cells in the array is read typically by the ATE and compared to the expected values from the predetermined repeating bit pattern. In the case of memory testing an integrated circuit (IC) such as an MCU including a controller (e.g., central processing unit (CPU)) and a non-volatile memory array, the IC can include a dedicated analog test pin for receiving the voltage or current from the ATE for the read operation so that the MCU can perform the search and read functions. The MCU may also generate the voltage or current levels for the read operation and perform the search and read functions, thus removing the need for the ATE for testing the memory array. A PASS is observed when all of the memory cells match with the expected value at one end of the search range, or the test is considered a FAIL otherwise at another end of the search range.

Based on the compare results, in the case of a FAIL, the external conditions (e.g., control voltage for VT testing) may be adjusted up or down by a predetermined fixed step size (e.g., 10 mV for $V_T$ testing) until the actual value read for all the cells in the array match with the expected value at the target resolution level for the search (thus providing a "convergence value"). Using a binary search scheme for conventional cells providing 2 states, this process typically involves multiple, iterative passes of reading all the cells in the memory array several times (stages) to find the convergence value, driving the test cost higher than desired.

SUMMARY

Disclosed embodiments recognize the additional test time for known binary memory array threshold voltage ($V_T$) and bit cell current (BCC) testing results because each pass (or stage) is treated as a separate, independent test point and does not utilize the data from previous test iterations for subsequent test points in subsequent tests. This forces duplicate reads of many of the cells within the memory array at conditions (voltage/current) on the passing side or near the pass-point of the binary search. In the case of a device such as a microcontroller (MCU) chip having a controller and a main flash memory array, due to the MCU architectural features (branch penalties, bus structure, etc.), the typically slower (compared to instruction) access time for flash memory, and low latency power supplies for test, re-reading cell locations that are known to have already passed is recognized herein to be more costly than additional steps within the search.

Disclosed embodiments include searching algorithms for testing non-volatile memory arrays that reduce test time, including a $V_T$ and/or BCC search method that reads the memory array stopping at the first memory cell fail in each stage of a multi-stage test. Disclosed embodiments also include reducing the step size of subsequent stages as the testing proceeds for voltage for $V_T$ testing or reference current for BCC testing until no more cells are read as a fail. For chips having a controller and non-volatile memory array such as MCU chips with an on-chip memory array, and if performing the search based on externally supplied voltage or current from an ATE ("tester"), disclosed embodiments include engaging a bi-directional (BIDI) communication handshake (HS) with the tester to control the voltage provided by the tester for $V_T$ testing or reference current for BCC testing. Disclosed embodiments also include exerting different external voltage for $V_T$ testing or reference current for BCC testing on each of the test sites (die or packages) simultaneously for parallel testing.

One disclosed embodiment comprises a multi-stage method of testing non-volatile memory arrays. After initialization, a first test stage including at least a first stage read uses a first step size for setting current for BCC testing and/or voltage for $V_T$ testing for reading at least some of the memory cells. A second test stage including at least one second stage read uses an adjusted step size less in magnitude than the first step size for reading at least some memory cells. Provided no bit pattern match by the second test stage and/or the adjusted step size does not meet a predetermined minimum resolution (PMR), one or more additional test stages including additional array searching are added using a fixed step size less in magnitude than the adjusted step size including at least one read until a final read determines the predetermined repeating bit pattern is matched and the fixed step size for the final read meets the PMR.

BRIEF DESCRIPTION OF THE DRAWINGS

Reference will now be made to the accompanying drawings, which are not necessarily drawn to scale, wherein:

FIG. 2A shows example VT 00/FF read measurements for a linear $V_T$ search, where the $V_T$ voltage provided by the tester is coupled to Test1 pin of a MCU chip having a non-volatile memory array, according to an example embodiment.

FIGS. 2B and 2C provide a general distribution of $V_T$ of memory cells for erased (1) and programmed (0) respectively, and the corresponding $V_T$ searches.

DETAILED DESCRIPTION

Figure 1:
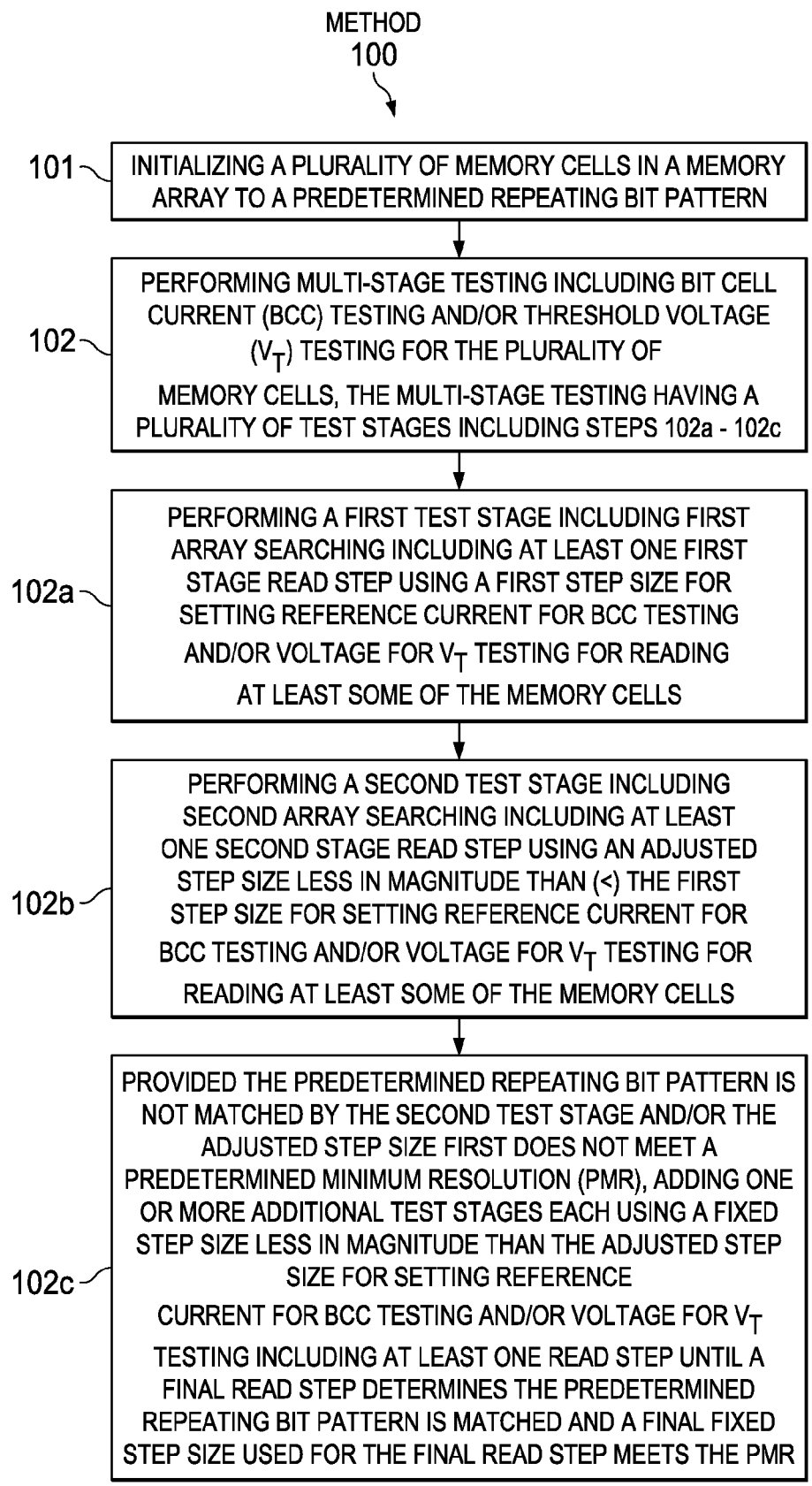
FIG. 1 is a flow chart that shows steps in an example multi-stage method of testing a non-volatile memory array including a plurality of memory cells, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example multi-stage method 100 of testing a non-volatile memory array including a plurality of memory cells according to an example embodiment. Step 101 comprises initializing the plurality of memory cells in the memory array to a predetermined repeating bit pattern. One example pattern is a checkerboard pattern including both programmed cells and erased cells.

Step 102 comprises performing multi-stage testing including bit cell current (BCC) testing and/or threshold voltage ($V_T$) testing for the plurality of memory cells. The multi-stage testing step 102 includes steps 102a to 102c described below. Step 102a comprises performing a first test stage including first array searching including at least one first stage read using a first step size for setting reference current for BCC testing and/or voltage for $V_T$ testing for reading at least some of the plurality of memory cells. Although method 100 is described having a single read for the first stage (step 102a), disclosed test stages generally include more than one read, where the voltage or current changes incrementally based on the step size for the stage during each successive read, such as a 100 mV step size where the step size remains constant during the reads implementing 4.9V, 4.8V, 4.7V, . . . etc., for successive reads in a first stage.

Step 102b comprises performing a second test stage including second array searching including at least one second stage read using an adjusted step size that is less in magnitude than (<) the first step size for setting reference current for BCC testing and/or voltage for $V_T$ testing for reading at least some of the plurality of memory cells. The second stage like the first stage and other disclosed stages generally includes more than one read, with the step size remaining constant during the reads between successive reads. If the predetermined repeating bit pattern is matched by the second test stage (a PASS) and the adjusted step size used for the match meets a predetermined minimum resolution for the search generally set by test engineering, such as 10 mV or 5 mV for $V_T$ testing, a convergence value is called and the search is completed.

Step 102c comprises provided the predetermined repeating bit pattern is not matched by the second test stage and/or the adjusted step size does not meet the PMR, adding one or more additional test stages each using a fixed step size less in magnitude than the adjusted step size for setting reference current for BCC testing and/or voltage for $V_T$ testing including at least one read until a final read determines the predetermined repeating bit pattern is matched and a fixed step size used for the final read meets the PMR.

As noted above, the additional stages generally include more than one read, with the step size (here the "adjusted step size") remaining constant during the reads, within a first additional stage, such as a 25 mV step size in one particular $V_T$ testing example, and a fourth and final test stage using a 10 mV step size which may meet the PMR.

Disclosed algorithms can start searching at one end of the voltage or current range while recording the first memory cell address in the memory array where the memory content fails to match with the expected (initialized/set) value. For chips having a controller (e.g., CPU) and non-volatile memory array such as MCU chips with a non-volatile memory array (see MCU 600 in FIG. 6A described below), the controller/MCU chip can use a BIDI communication handshake with the tester to control the external voltage or current provided by the tester to the MCU chip. In this embodiment upon detecting a FAIL, disclosed algorithms use a BIDI handshake to signal the tester to adjust the external voltage or current in small steps (or increment) and the MCU resumes searching from the first known failing memory address (thus avoiding retesting passing cells) which is generally stored in memory on the MCU (e.g., in SRAM). With the voltage for $V_T$ testing or current for BCC testing change, the memory content may match again with the expected value(s) for the entire array (PASS) or fail at an address in the array further along.

The search stops at the convergence value after a PASS is observed, where all memory cell content (bit states) matches with their expected value. In the BIDI communication handshake for the controller/MCU embodiment a special signal can be provided on some selected input/output (IO) pins of the MCU (see TP1-TP4 in FIG. 6A described below) to signal the tester to perform any of the following actions: (1) stop the search upon convergence (for a PASS), (2) adjust the external voltage or reference current to continue the search (for a FAIL) in a next/subsequent stage, (3) change the step size for the next stage, (4) wait while the memory array is being read by the controller/MCU, or (5) "backtracking" (described below). In the wait step (4), the controller's/MCU's $V_T$ search may be temporarily paused while waiting for the ATE to adjust the external voltage value or ref current value for BCC, after which the ATE can send out another IO signal to the MCU to resume the $V_T$ or BCC search. This BIDI handshake can be communicated separately on each test site (each die for wafer probe or each package for package test), which is enabled by the ATE being able to simultaneously apply different external voltage or reference current values independently to each site for parallel testing.

A multi-stage search scheme may be employed to expedite the search process by using a larger step size magnitude in the earlier stages of the search as compared to later stages. The multi-stage search scheme can begin with the largest step size magnitude and then reduce the step size magnitude sequentially at each stage as the external voltage or reference current approaches the convergence value by analyzing the failing cell address and memory content read. In the case of a "miss" before the last stage (i.e. observing a PASS at a step size greater than the predetermined minimum step size), the $V_T$ or BCC search can have a self-correcting feature referred to herein as "backtracking" to reach convergence.

Backtracking can comprise steps 1) to 6), as follows:
1) the controller storing the first failing address (first known failing cell address) and/or a digital representation (code) as used by an onboard DAC corresponding the last applied voltage/current level from the search algorithm in other memory such as in SRAM (e.g., see FIGS. 6C and 6D described below);
2) the controller detecting a match in read memory content with the expected pattern (i.e. getting a PASS before reaching the last stage);
3) the controller sending a PASS signal and also a "backtrack" signal to tester, wherein the tester adjusts the external voltage/current back to the last applied voltage or reference current value or retrieves the previous digital "code" form from other memory and instructs the DAC to reapply the voltage or reference current level corresponding to that code by the interface specified by the DAC;
4) the controller advancing to the next stage with a smaller magnitude step size from the last applied voltage or reference current value from the tester, or using a smaller increment in the digital "code" corresponding to voltage or reference current;
5) the controller restoring the first known failing cell address as the starting address of the next search stage, and
6) the controller resuming the $V_T$ or BCC search in the same way until it converges in the last stage.

$V_T$ and BCC searching may be combined. In typical operation the main memory array may be programmed to a checkerboard pattern before the data retention bake, so that half of the memory cells in the array are programmed (0) whereas the other half of the cells are erased (1). The $V_T$ search in this case could be applied on programmed cells and the BCC method on the erased cells, so the searching performed depends on the state of each cell. BCC is generally not applied to programmed flash cells due to the low level current of the transistor with the charges on the floating gate such that the sense amp comparator is not capable of differentiating between the noise floor and the actual bit cell current. However, disclosed embodiments are not limited to BCC testing of erased cells and $V_T$ testing to programmed cells as the suitability of each method can depend on intricacies of the sensing mechanism, not on the cell or the algorithm.

As described above, a BIDI handshake can be used to test an IC device such as a microcontroller (MCU) chip including a controller and non-volatile memory array (e.g., a main flash memory array). FIG. 2A shows example VT 00/FF Read Measurements using a linear $V_T$ search, by using a test control register level which enables the controller/MCU chip to go into a search mode (e.g., $V_T$ search mode for $V_T$ testing), where the VT voltage provided by the tester is coupled to the Test1 pin of the controller/MCU chip (see MCU 600 in FIG. 6A described below). FIGS. 2B and 2C provide a general distribution of $V_T$ of memory cells for erased (1) and programmed (0) respectively, and the corresponding $V_T$ searches.

Four (4) example related BIDI search embodiments are described below as BIDI1 to BIDI4 with respect to $V_T$ searching. BIDI1 VT is linear search (fixed-voltage change between stages) that generally uses a fixed relatively small voltage step size for VT testing, e.g. 10 mV, stopping on the first PASS. BIDI2 $V_T$ is a 2-stage search starting with a medium voltage step size (e.g. 25 mV) that changes to the small step size (e.g., 10 mV for $V_T$ testing) that can reflect the required resolution level for the search after passing the first few bytes (B) of the memory array.

In one particular embodiment the memory array has a size of 256 KB, and a byte size (B) is 8 bits. BIDI3 $V_T$ is a 3-stage search starting with a larger voltage step size e.g. 100 mV on the first stage, changing to the medium step size e.g. 30 mV in the second stage after passing the first few bytes of the memory array, that changes to a relatively small step size (e.g., 10 mV, the required resolution level for the search) for the third and final stage after crossing a threshold boundary such as 30% of the array size (e.g., 76.8 KB of 256 KB). BIDI3 includes backtracking as described above to the last voltage for $V_T$ testing or last reference current for BCC testing and failing address if passing before the last stage, changing to the next step size, then resuming the $V_T$ search (this may only happen on a small portion of the die for wafer level test with the proper setting).

BIDI4 $V_T$ is a 4-stage search starting with an even larger relative voltage step size (e.g., 400 mV) in the first stage before observing the first cell to have a bit change (FAIL). The remaining 3 stages (rest of BIDI4) can operate as described above for BIDI3.

Figure 3:
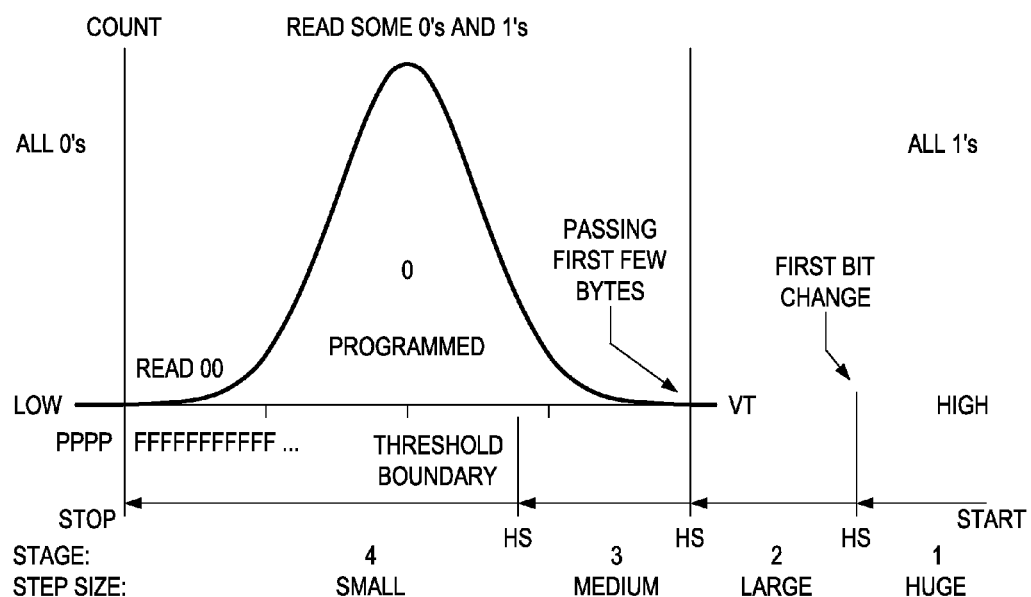
FIG. 3 shows an example BIDI4 (linear) VT0min search having 4 stages each with different step sizes, according to another example embodiment.

FIG. 3 shows an example BIDI4 VT0min linear search having 4 stages which provides a description of a multi-stage search scheme for $V_T$ on programmed cells. As shown, at stage 1 (large relative voltage step size) there is no cell having a bit change observed for the cells in the array. In stage 2 (large relative voltage step size) some bit changes for the cells is observed, still failing to pass the first few bytes. Stage 3 (medium relative voltage step size) is shown passing the first few bytes of cells in the array but before the predetermined threshold boundary (e.g. 30% of the array size), and stage 4 uses a small relative voltage step size (that can reflect required resolution level for the search) after crossing the predetermined threshold boundary.

Returning to the BIDI4 $V_T$ search, the search can start with a high (or low) voltage such that the initial array read will fail and the first "fail" cell address which is generally recorded on other non-volatile memory on the IC, such as in SRAM. The external voltage for $V_T$ testing can then be decreased (or increased) by a certain step size in each stage (e.g. 50 mV), and the flash array (or other non-volatile memory array) can be re-read starting at the first "fail" address to see if it now fails at a further address. With the voltage updated for $V_T$ testing, the first "fail" cell address may advance past the worst cell and finish reading the memory array once for a final "PASS" for the array.

Using a bigger step size(s) in a multi-stage search saves test time but may risk missing the convergence value at the end of the search. In the case the $V_T$ search misses the worst cell while reporting an overall PASS using a step size >the PMR, the search method can implement backtracking as described above to resume the search with a new stage having smaller step size for convergence in the correct voltage or reference current beginning the first read of the new stage at the first "fail" cell address. The "first" fail address is stored in other non-volatile memory (e.g., SRAM) whenever a cell fails to match with its bit state from the expected pattern at a certain reference current or voltage level, regardless of the step size.

Figure 4A:
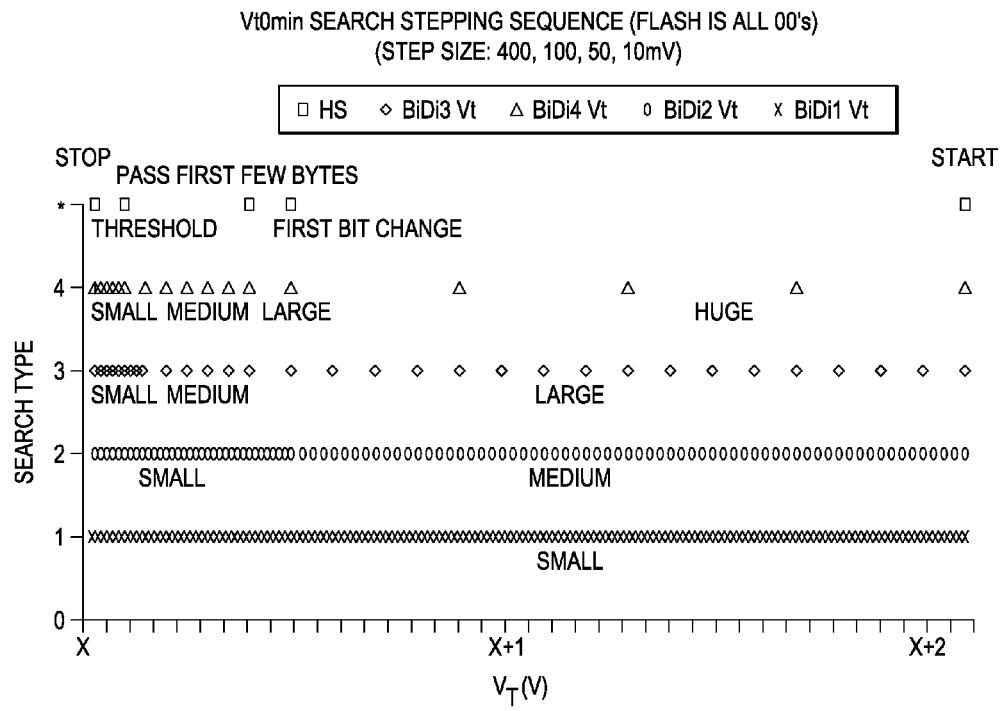
FIGS. 4A and 4B show an example BIDI4 (4 stages each with a different step size) VT0min search where the flash array is initialized to all 00's, according to example embodiments.
Figure 4B:
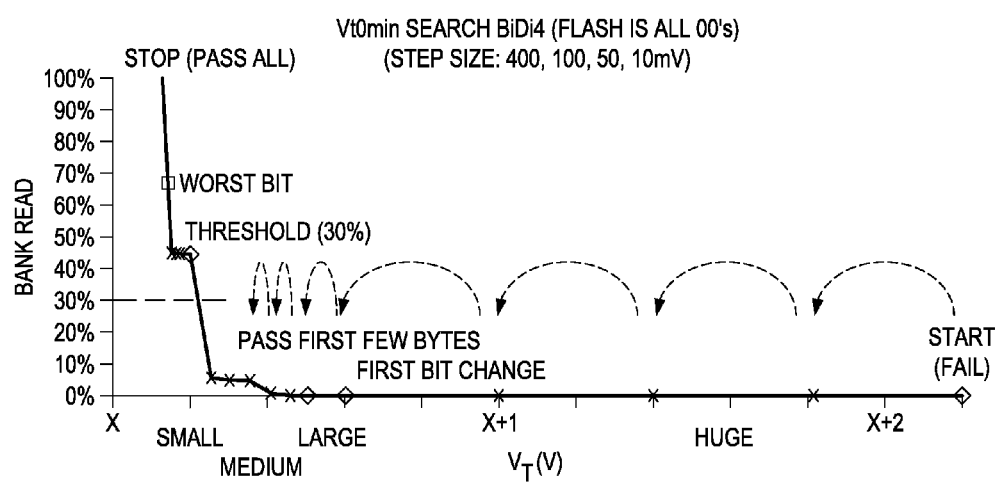

FIGS. 4A and 4B show an example BIDI4 VT0min search showing example voltage step sizes of 400 mV, 100 mV, 50 mV and 10 mV, where the flash array is initialized to be all programmed (00's). The y-axis shows the % of the memory array read, and the x-axis the applied $V_T$. FIG. 4B demonstrates a change (here a decrease) in the voltage incrementally during each read step of the main memory array, with the step size remaining constant during the reads within each respective stage. For example, as shown, the first stage features four (4) 0.4 V read steps, the second stage features 3 (3) 0.1 V read steps, the third stage is a single 0.05 V read step, and the fourth stage is a single 0.01 V read step, with the total voltage spanned of about 2V.

Figure 5A:
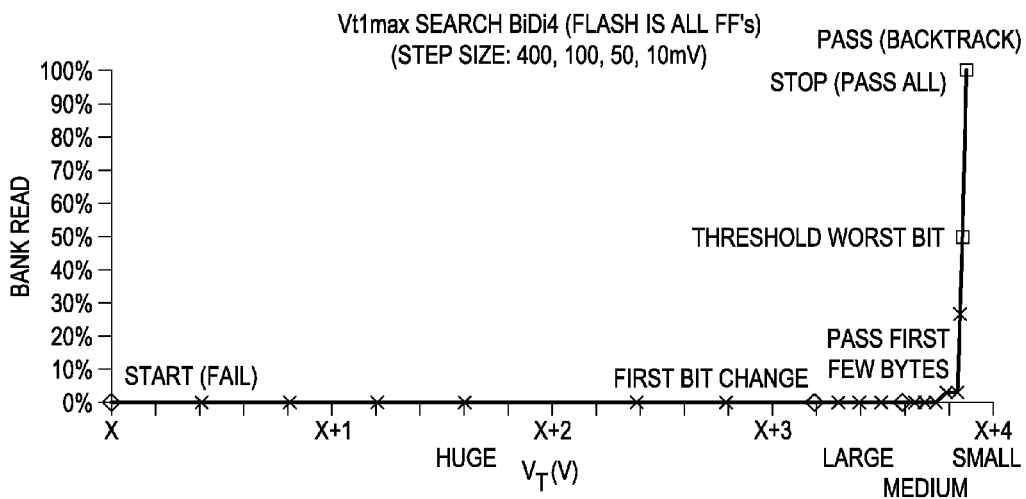
FIGS. 5A and 5B show an example BIDI4 VT search featuring backtracking where the flash array is initialized to all FF's, according to example embodiments.
Figure 5B:
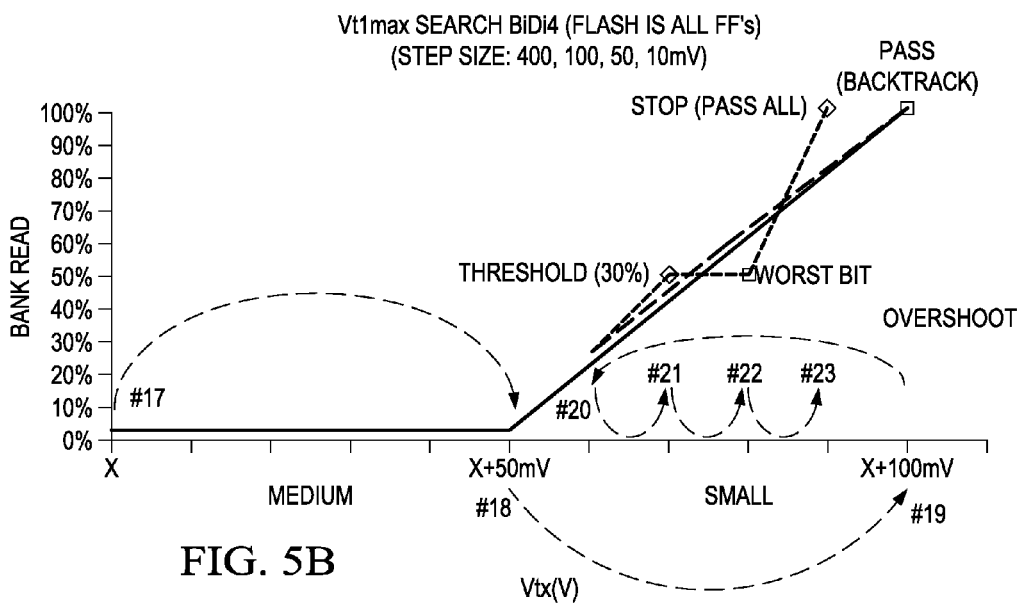

FIGS. 5A and 5B show an example BIDI4 VT1max search featuring backtracking where the flash cells are initialized to be FF's (11's). As with FIGS. 4A and 4B, the voltage is changed (here increased) incrementally during each read step of the main memory array with the step size remaining constant within each respective stage. Two (2) increments of the third stage are shown (0.05 V steps), with the last increment (19th read) of the third stage resulting in an overshoot, leading to the disclosed backtracking shown between read step 19 and read step 20. The $V_T$ for read step 20 is the $V_T$ for read step 18+the step size for the 4th stage of 0.01V, which is clearly less than the $V_T$ for read step 19. The final convergence occurs at read step 23, the $V_T$ of which is smaller than the $V_T$ at read step 19, where the $V_T$ search stops.

Figure 6A:
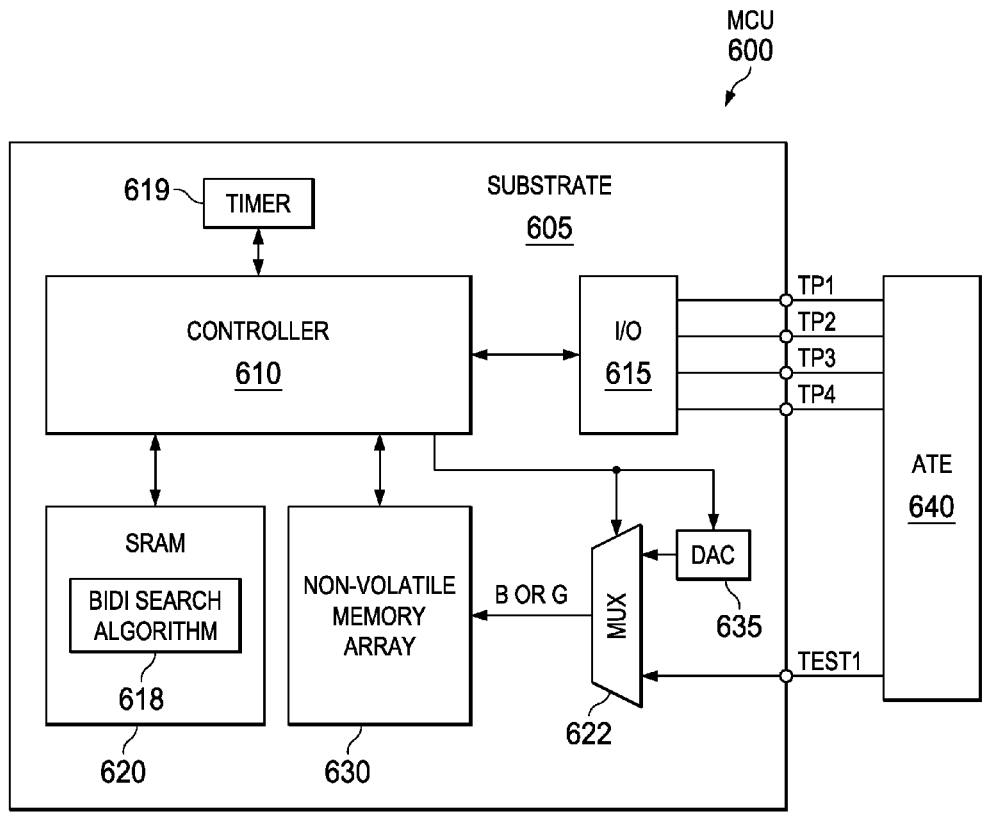
FIG. 6A is a block diagram of an integrated MCU device including a controller, a main non-volatile memory with a disclosed I/O pin configuration including Test1, testpin (TP) 1, TP2, TP3 and TP4 for enabling BIDI testing with a tester, having a disclosed BIDI VT/BCC search algorithm stored in an additional memory shown as a SRAM.

FIG. 6A is a block diagram of an integrated MCU 600 including a substrate 605 having a semiconductor surface (e.g., silicon) with the components shown in FIG. 6A built thereon. MCU 600 includes a controller (e.g., central processing unit (CPU)) 610, a main non-volatile memory array (e.g., flash memory array) 630 with a disclosed (I/O) pin configuration including Test1, Testpin (TP) 1, TP2, TP3 and TP4 coupled to input/output (I/O) block 615. Although MCU 600 is shown having 4 TP's, disclosed MCU's may include more or less than 4 TP's.

MCU 600 includes a timer (or clock) 619 and an optional on-chip digital to analog converter (DAC) 635. For enabling BIDI testing with a tester such as ATE 640, MCU device 600 includes a disclosed BIDI VT/BCC search algorithm 618 stored in an additional non-volatile memory array shown as SRAM 620.

DAC 635 is coupled to receive digital output codes from the controller 610 while implementing a disclosed search algorithm 618 stored in SRAM 620. DAC 635 may alternatively also be part of the tester shown as ATE 640 in FIG. 6A. The output from the DAC 635 together with an external voltage signal from ATE 640 coupled to the TEST1 pin of MCU 600 are both provided to a multiplexer MUX 622 which is coupled to and controlled by controller 610, where MUX 622 is operable to output a controlled current level B (for BCC testing) or a controlled voltage level G (for $V_T$ testing) to the non-volatile memory array 630 for testing the cells of the non-volatile memory array (see FIGS. 6B-6D described below).

Test1 is an analog pin that monitors the voltage provided by the ATE 640 for VT testing and current provided for BCC testing when reading the memory cells in memory array 630. TP1 is for sending a PASS/FAIL signal from the MCU 600 to the ATE 640. TP2 is for a handshake from MCU 600 to the ATE 640 to change the $V_T$ level on the Test1 pin for $V_T$ testing or reference current for BCC testing, so that the search is paused during a level change. TP3 is for a handshake from the ATE 640 to the MCU 600 signaling that the voltage change for $V_T$ testing or reference current change for BCC testing on the Test1 pin is completed, so that the search can be resumed by MCU 600. TP4 is for a handshake from MCU 600 to the ATE 640 to allow the ATE 640 to change the step size that as disclosed above is generally changed (reduced in magnitude) between successive read stages, but held constant during a given read stage.

Figure 6B:
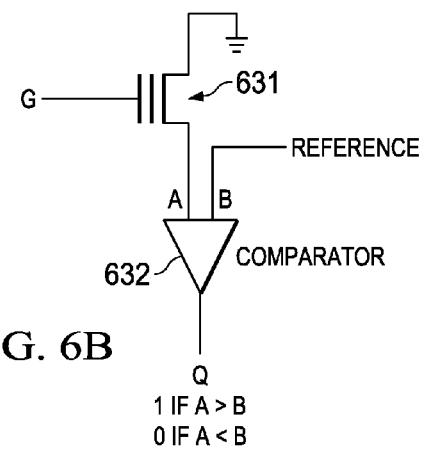
FIG. 6B is a test depiction showing testing of a single memory cell shown as a flash cell (with dual gates) showing an applied gate voltage (G) (which is fixed for BCC testing and is changed in each read step for $V_T$ testing) varied with the resulting test signal from the flash cell shown as A being compared by a comparator to a reference level B (which is fixed from $V_T$ testing and is changed in each read step for BCC testing) to determine the state (Q) of the flash memory cell.

FIG. 6B is a test depiction showing testing of a single memory cell 631 shown as a flash cell (with 2 gates) showing an applied gate voltage (G) (which is fixed for BCC testing and may be changed in each read step for $V_T$ testing) varied with the resulting signal from the flash cell 631 shown as A being compared by a comparator 632 generally provided by controller 610 to a reference level B (which is fixed for VT testing and may be changed in each read step for BCC testing) to determine the state (Q) of the flash cells as a 1 or a 0.

Figure 6C:
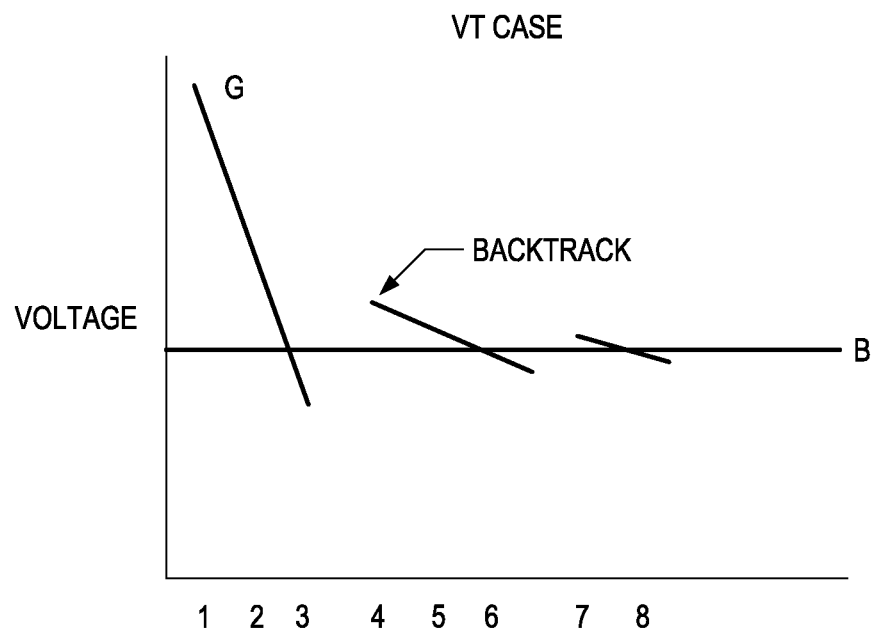
FIG. 6C depicts multi-iteration VT testing showing G varying per read step (for 8 read steps) and a constant B including a backtrack.

FIG. 6C depicts multi-iteration VT testing showing G varying per read step (8 read steps shown) and a constant B including backtracking See FIG. 6B for application of G to the gate of memory cell 631 for $V_T$ testing.

Figure 6D:
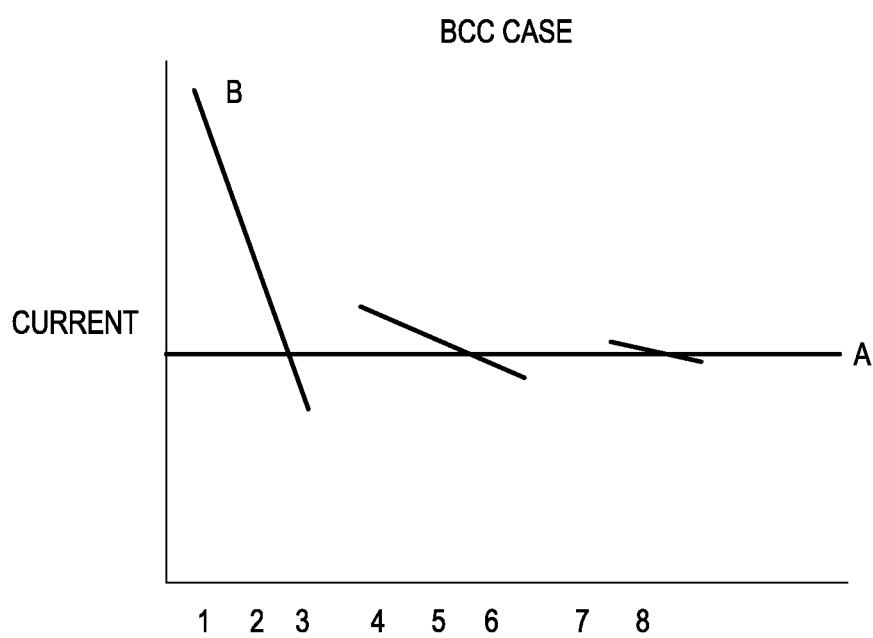
FIG. 6D depicts multi-iteration BCC testing showing B varying per read step (for 8 read steps) and a constant A including a backtrack.

FIG. 6D depicts multi-iteration BCC testing showing B varying per read step (8 read steps shown) and a constant A including backtracking See FIG. 6B for application of B as a current reference to test memory cell 631 for BCC testing.

Figure 7:
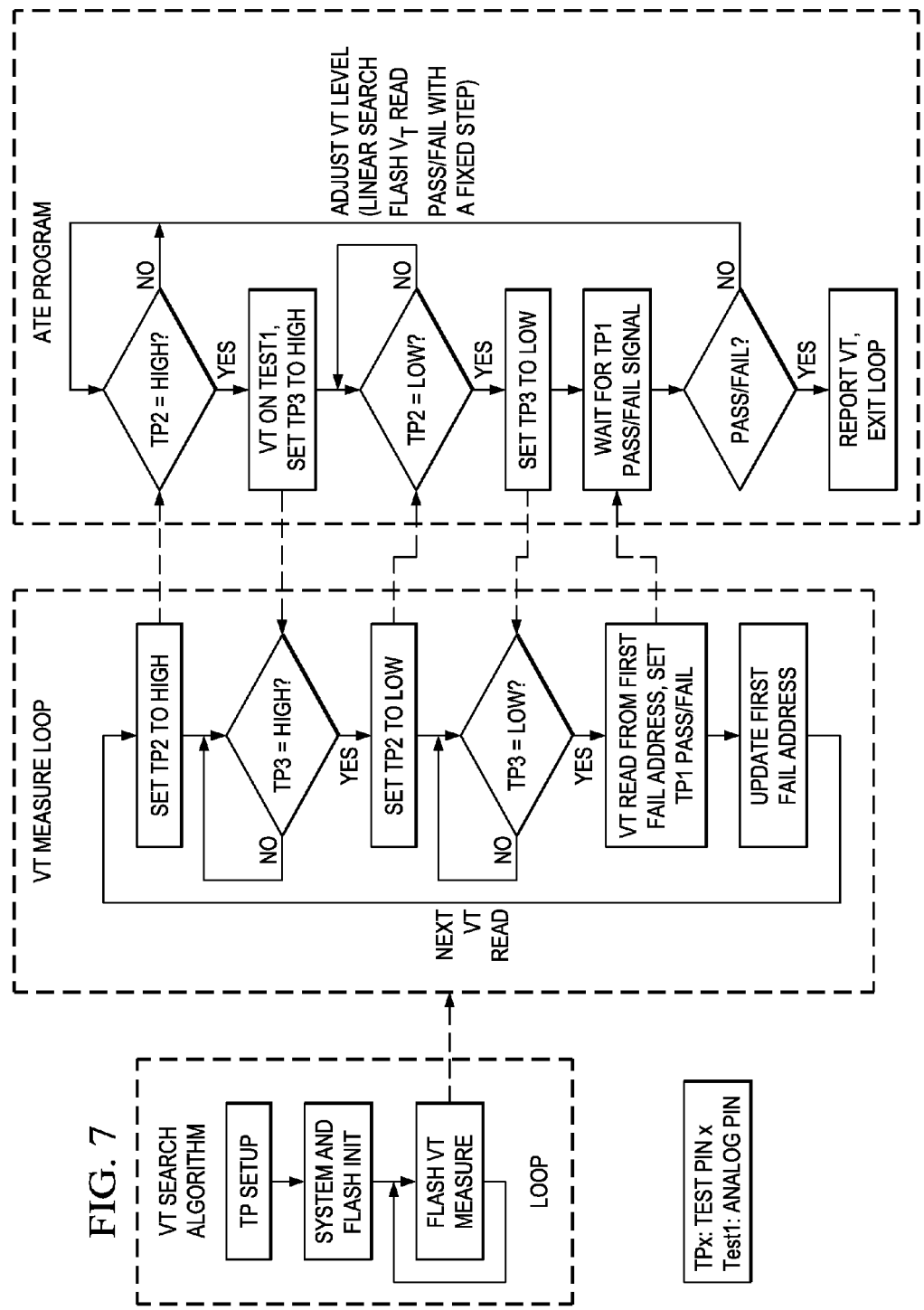
FIG. 7 shows an example VT BIDI1 search handshake process flow according to an example embodiment.

FIG. 7 shows an example VT BIDI1 search (linear search) communication handshake process flow between MCU and tester, including the MCU storing the first failing cell address (shown as the "last fail address") in the array per stage as part of the VT measurement loop. The MCU runs the $V_T$ measure loop, while the tester runs the ATE program shown. Pin activities for the MCU are shown for Test1 and TP1, TP2, TP3 and TP4.

Figure 8:
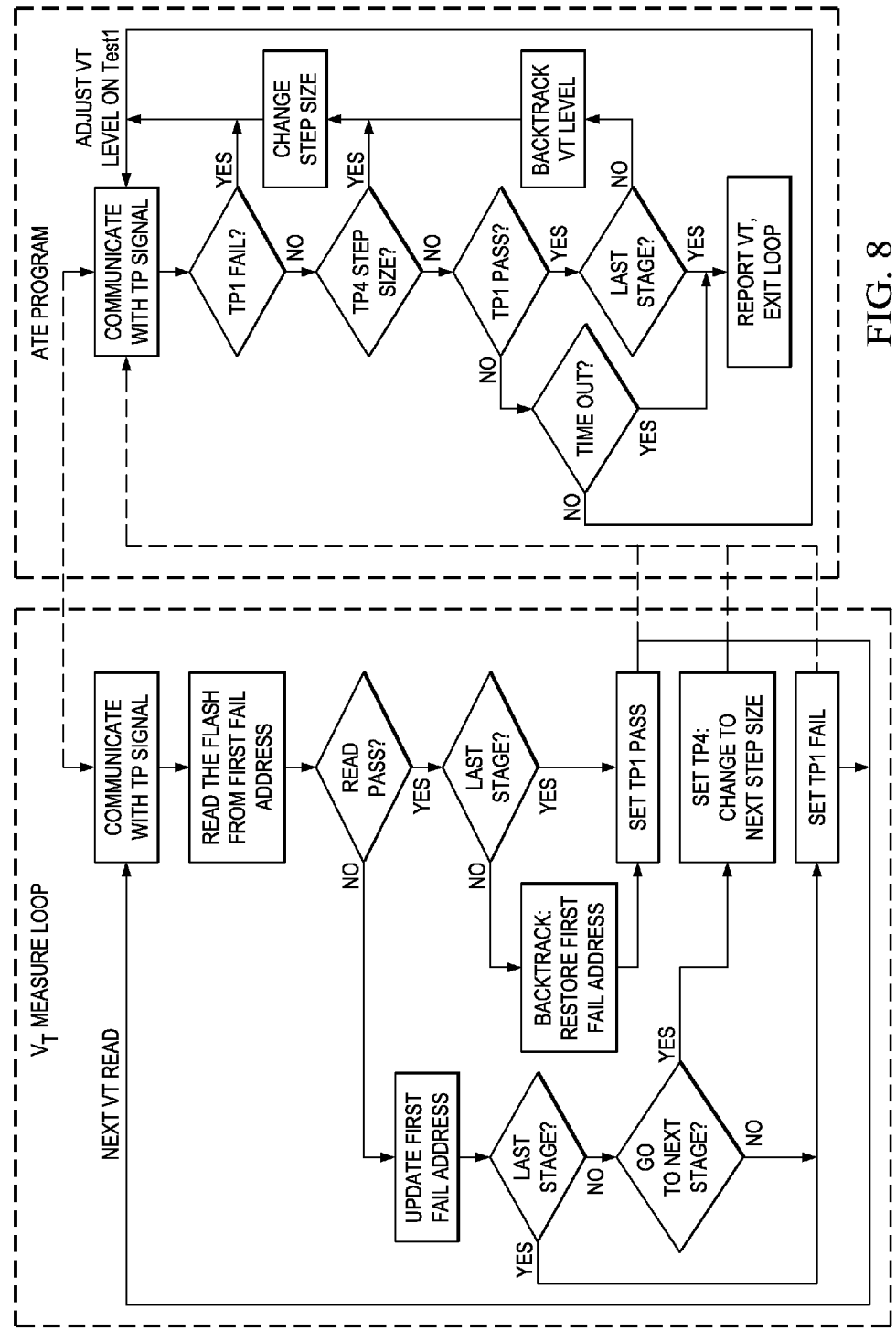
FIG. 8 shows an example VT BIDI4 multi-stage handshake process flow according to an example embodiment.

FIG. 8 shows an example VT BIDI4 (4-voltage level/stage search) multi-stage communication handshake process flow including storing the first failing cell address in the array per stage (shown as the "last fail address") as part of the VT measurement loop. Pin activities are shown for Test1 and TP1, TP2, TP3 and TP4. Regarding example implementation details, as noted above, the MCU chip having the non-volatile memory array such as a flash array can send out a special handshake signal to the tester for implementing the tester changing the step size and disclosed backtracking A GIO (general purpose input/output) signal may be used for this special handshake communication.

There are a few factors that can be used in customizing the BIDI4 $V_T$ search. The step size in each stage can be changed, with 400 mV (during the first stage) and 10 mV for the 4th (last) stage being adjustable. The threshold boundary (e.g. 30% of the flash size) which can be used as described above to trigger changing stages can also be customized. As described above, disclosed embodiments intend to read the cells in the memory array only once and can use a different step size in successive stages to expedite the VT/BCC search, which can be employed in a highly parallel, multi-site testing solution through a bi-directional communication handshake protocol between the tester and the controller die (e.g., MCU). Advantages of disclosed embodiments include taking substantially fewer accesses or steps (typically 50% 80% less) to search for the VT (threshold voltage) or BCC (compared to binary search), and therefore runs faster in a single pass of the VT and/or BCC search.

For controller die embodiments (e.g. MCU), all of the test sites (die for wafer probe or packages for package test) can reach convergence conditions (voltage) independently through separate BIDI communications with the tester. This method takes advantage of the nature of the VT or BCC searches where the value of interest is a maximum or minimum voltage or current value within an array and not properties of individual memory cells which leads most arrays to have VT or BCC measurements of similar value, for example. This method allows a reduction in the number of accesses and iterations for most units while still allowing valid measurements for memory arrays with deviant distributions, thereby maximizing quality (desired resolution) and yield (wide search range) and reducing test cost (lower average test time per touchdown).

Disclosed embodiments can be used to test a variety of different IC devices and related products. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of testing a non-volatile memory array including a plurality of memory cells, comprising:
   initializing said plurality of memory cells to a bit pattern; and
   performing multi-stage testing including bit cell current (BCC) testing and/or threshold voltage ($V_T$) testing for said plurality of memory cells, said multi-stage testing having a plurality of test stages including:
      performing a first stage testing including reading at least one of said plurality of memory cells, said first stage testing includes using a first step size for setting a reference current for said BCC testing and/or for setting a reference voltage for said $V_T$ testing,
      recording an address of a memory cell of said plurality of memory cells corresponding to a first failure, said first failure occurring when a read value of said plurality of memory cells does not match said initialized bit pattern of said plurality of memory cells, and
      performing a second stage testing including reading at least one of said plurality of memory cells, said second stage testing includes using an adjusted step size that is less in magnitude than (<) said first step size for setting said reference current for said BCC testing and/or for setting said reference voltage for said $V_T$ testing, wherein said second stage testing begins from said memory cell address corresponding to said first failure.

2. The method of claim 1, wherein said bit pattern includes both programmed cells and erased cells, wherein said $V_T$ testing is applied to said programmed cells and said BCC testing is applied to said erased cells.

3. The method of claim 1, further comprising:
   determining if a percentage of said non-volatile memory array matches said initialized bit pattern, and provided said percentage of said non-volatile memory array matches said initialized bit pattern, advancing to a next one of said plurality of test stages.

4. The method of claim 1, wherein said non-volatile memory array is part of an integrated microcontroller (MCU) device that includes a controller and another non-volatile memory, further comprising:
   recording, by said MCU device, the address of said memory cell corresponding to said first failure, and
   implementing a bi-directional (BIDI) communication handshake with an automatic test equipment (tester) to signal to said tester to command said reference current level for said BCC testing and/or said reference voltage level for said $V_T$ testing to said controller,
   wherein said controller resumes testing beginning from said memory cell corresponding to said first failure using said reference current level for said BCC testing and/or said reference voltage level for said $V_T$ that was commanded.

5. The method of claim 4, wherein said MCU device includes a plurality of dedicated memory testing pins for supporting said BIDI communication handshake, wherein implementing said BIDI communication handshake signals on some of said dedicated memory testing pins are sent to signal said tester causing said tester to:
adjust said reference current level for said BCC testing and said reference voltage level for said $V_T$ testing following said first failure,
change a step size for a next of said plurality of test stages, and
wait while said non-volatile memory array is being read by said MCU device.

6. The method of claim 1, wherein said plurality of test stages further comprising:
performing one or more additional stages of testing for reading at least one of said plurality of memory cells when said initialized bit pattern of said plurality of memory cells does not match read values corresponding to said second stage testing and/or said adjusted step size does not meet a predetermined minimum resolution (PMR), said one or more additional stages of testing include using a fixed step size that is less in magnitude than said adjusted step size for setting said reference current for said BCC testing and/or for setting said reference voltage for said $V_T$ testing, said one or more additional stages of testing performed until said reading results in a match with said initialized bit pattern for said at least one of said plurality of memory cells and said fixed step size used for said reading meets said PMR.

7. The method of claim 6 further comprising:
sensing an overstepping in one of said plurality of test stages by determining that said initialized bit pattern is matched with read bit pattern corresponding to said second stage of testing but said adjusted step size does not meet said PMR, then backtracking in magnitude of a level of said reference current for said BCC testing and/or a level of said reference voltage for said $V_T$ testing including beginning a subsequent one of said plurality of test stages.

8. The method of claim 6, wherein said one or more additional stages of testing comprises a third stage of testing after said first stage of testing and then a fourth stage of testing, wherein said fixed step size for said fourth stage of testing is less in magnitude than said fixed step size of said third stage of testing.

9. The method of claim 1, wherein said initialized bit pattern is a repeating bit pattern.

10. A method for testing an integrated microcontroller (MCU) device having a controller, a non-volatile memory array including a plurality of memory cells coupled to said controller, and another non-volatile memory coupled to said controller, comprising:
initializing said plurality of memory cells to a bit pattern; and
performing multi-stage testing including bit cell current (BCC) testing and/or threshold voltage ($V_T$) testing for said plurality of memory cells, said multi-stage testing having a plurality of test stages including:
performing a first stage testing including reading at least one of said plurality of memory cells, said first stage testing includes using a first step size for setting a reference current for said BCC testing and/or for setting a reference voltage for said $V_T$ testing,
recording, by said MCU device, an address of a memory cell of said plurality of memory cells corresponding to a first failure, said first failure occurring when a read value of said plurality of memory cells does not match said initialized bit pattern of said plurality of memory cells, and
performing a second stage testing including reading at least one of said plurality of memory cells, said second stage testing includes using an adjusted step size that is less in magnitude than (<) said first step size for setting said reference current for said BCC testing and/or for setting said reference voltage for said $V_T$ testing,
wherein
implementing a bi-directional (BIDI) communication handshake with an automatic test equipment (tester) to signal to said tester to command said reference current level for said BCC testing and/or said reference voltage level for said $V_T$ testing to said controller, and
wherein said controller resumes testing beginning from said memory cell corresponding to said first failure using said reference current level for said BCC testing and/or said reference voltage level for said $V_T$ that was commanded.

11. The method of claim 10, wherein said MCU device includes a plurality of dedicated memory testing pins for supporting said BIDI communication handshake, wherein implementing said BIDI communication handshake signals on some of said dedicated memory testing pins are sent to signal said tester causing said tester to:
adjust said reference current level for said BCC testing and said reference voltage level for said $V_T$ testing following said first failure,
change a step size for a next of said plurality of test stages, and
wait while said non-volatile memory array is being read by said MCU device.

12. The method of claim 10, wherein said plurality of test stages further comprising:
performing one or more additional stages of testing for reading at least one of said plurality of memory cells when said initialized bit pattern of said plurality of memory cells does not match read values corresponding to said second stage testing and/or said adjusted step size does not meet a predetermined minimum resolution (PMR), said one or more additional stages of testing include using a fixed step size that is less in magnitude than said adjusted step size for setting said reference current for said BCC testing and/or for setting said reference voltage for said $V_T$ testing, said one or more additional stages of testing performed until said reading results in a match with said initialized bit pattern for said at least one of said plurality of memory cells and said fixed step size used for said reading meets said PMR.

13. The method of claim 12 further comprising:
sensing an overstepping in one of said plurality of test stages by determining that said initialized bit pattern is matched with read bit pattern corresponding to said second stage of testing but said adjusted step size does not meet said PMR, then backtracking in magnitude of a level of said reference current for said BCC testing and/or a level of said reference voltage for said $V_T$ testing including beginning a subsequent one of said plurality of test stages.

14. The method of claim 12, wherein said one or more additional stages of testing comprises a third stage of testing after said first stage of testing and then a fourth stage of testing, wherein said fixed step size for said fourth stage of testing is less in magnitude than said fixed step size of said third stage of testing.

15. The MCU device of claim 12, wherein said one or more additional stages of testing comprises a third stage of testing after said first stage of testing and then a fourth stage of testing, wherein said fixed step size for said fourth stage of testing is less in magnitude than said fixed step size of said third stage of testing.

16. An integrated microcontroller (MCU) device, comprising:
   a substrate having a semiconductor surface;
   a controller embedded partially in active regions under said semiconductor surface;
   an input/output (I/O) block embedded partially in active regions under said semiconductor surface coupled to said controller that is connected to a plurality of test pins provided by said MCU device;
   a first non-volatile memory array embedded partially in active regions under said semiconductor surface including a plurality of memory cells coupled to said controller,
   a second non-volatile memory embedded partially in active regions under said semiconductor surface coupled to said controller storing a search algorithm, said search algorithm implementing:
      initializing said plurality of memory cells to a bit pattern, and
      performing multi-stage testing including bit cell current (BCC) testing and/or threshold voltage ($V_T$) testing for said plurality of memory cells, said multi-stage testing having a plurality of test stages including:
         performing a first stage testing including reading at least one of said plurality of memory cells, said first stage testing includes using a first step size for setting a reference current for said BCC testing and/or for setting a reference voltage for said $V_T$ testing,
         recording an address of a memory cell of said plurality of memory cells corresponding to a first failure, said first failure occurring when a read value of said plurality of memory cells does not match said initialized bit pattern of said plurality of memory cells, and
         performing a second stage testing including reading at least one of said plurality of memory cells, said second stage testing includes using an adjusted step size that is less in magnitude than (<) said first step size for setting said reference current for said BCC testing and/or for setting said reference voltage for said $V_T$ testing, wherein said second stage testing begins from said memory cell address corresponding to said first failure.

17. The MCU device of claim 16, said search algorithm further implementing:
   recording, by said MCU device, said address of said memory cell corresponding to said first failure, and
   implementing a bi-directional (BIDI) communication handshake with an automatic test equipment (tester) to signal to said tester to command said reference current level for said BCC testing and/or said reference voltage level for said $V_T$ testing to said controller,
   wherein said controller resumes testing beginning from said memory cell corresponding to said first failure using said reference current level for said BCC testing and/or said reference voltage level for said $V_T$ that was commanded.

18. The MCU device of claim 16, wherein said first non-volatile memory array is a flash memory array.

19. The MCU device of claim 16, further comprising:
   a digital to analog converter (DAC) and a multiplexer (MUX) embedded partially in active regions under said semiconductor surface both coupled to said controller, wherein said DAC is coupled to drive one input of said MUX and a tester drives another input of said MUX, and wherein said DAC is coupled to receive digital output codes from said controller.

20. The MCU device of claim 16, wherein said search algorithm further implementing:
   performing one or more additional stages of testing for reading at least one of said plurality of memory cells when said initialized bit pattern of said plurality of memory cells does not match read values corresponding to said second stage testing and/or said adjusted step size does not meet a predetermined minimum resolution (PMR), said one or more additional stages of testing include using a fixed step size that is less in magnitude than said adjusted step size for setting said reference current for said BCC testing and/or for setting said reference voltage for said $V_T$ testing, said one or more additional stages of testing performed until said reading results in a match with said initialized bit pattern for said at least one of said plurality of memory cells and said fixed step size used for said reading meets said PMR.

21. The MCU device of claim 20, said search algorithm further implementing:
   sensing an overstepping in one of said plurality of test stages by determining that said initialized bit pattern is matched with read bit pattern corresponding to said second stage of testing but said adjusted step size does not meet said PMR, then backtracking in magnitude of a level of said reference current for said BCC testing and/or a level of said reference voltage for said $V_T$ testing including beginning a subsequent one of said plurality of test stages.

* * * * *